US010698245B2

(12) United States Patent
Imazeki et al.

(10) Patent No.: US 10,698,245 B2
(45) Date of Patent: Jun. 30, 2020

(54) DISPLAY DEVICE

(71) Applicant: Japan Display Inc., Tokyo (JP)

(72) Inventors: Yoshikatsu Imazeki, Tokyo (JP); Hayato Kurasawa, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/263,273

(22) Filed: Jan. 31, 2019

(65) Prior Publication Data

US 2019/0235299 A1 Aug. 1, 2019

(30) Foreign Application Priority Data

Jan. 31, 2018 (JP) ................................ 2018-014655

(51) Int. Cl.
| | |
|---|---|
| *G02F 1/1362* | (2006.01) |
| *H01L 23/48* | (2006.01) |
| *G06F 3/041* | (2006.01) |
| *G02F 1/1333* | (2006.01) |
| *G02F 1/1345* | (2006.01) |
| *H01L 23/60* | (2006.01) |
| *H01L 23/482* | (2006.01) |
| *H01L 23/522* | (2006.01) |

(52) U.S. Cl.
CPC .... *G02F 1/13338* (2013.01); *G02F 1/136204* (2013.01); *G02F 1/1345* (2013.01); *G02F 1/13452* (2013.01); *G02F 1/13458* (2013.01); *G02F 2202/22* (2013.01); *G06F 3/04164* (2019.05); *H01L 23/481* (2013.01); *H01L 23/4824* (2013.01); *H01L 23/5226* (2013.01); *H01L 23/60* (2013.01)

(58) Field of Classification Search
CPC . G02F 2202/22; H01L 23/60; H01L 23/4824; H01L 23/481; H01L 23/5226; H01J 2329/8685; G06F 3/04164; G06F 3/0416; G06F 3/044; G06F 3/0446
See application file for complete search history.

(56) References Cited

U.S. PATENT DOCUMENTS

| | | | |
|---|---|---|---|
| 2015/0241745 A1 | 8/2015 | Tashiro | |
| 2017/0053949 A1* | 2/2017 | Shin | ................. G02F 1/136286 |
| 2018/0031939 A1 | 2/2018 | Imazeki | |
| 2018/0033617 A1 | 2/2018 | Imazeki et al. | |
| 2019/0265532 A1* | 8/2019 | Yamazaki | ............. G02F 1/1368 |

FOREIGN PATENT DOCUMENTS

| | | |
|---|---|---|
| JP | 2015-161753 A | 9/2015 |
| JP | 2018-017977 A | 2/2018 |
| JP | 2018-025757 A | 2/2018 |

* cited by examiner

*Primary Examiner* — Angela K Davison
(74) *Attorney, Agent, or Firm* — K&L Gates LLP

(57) ABSTRACT

According to one embodiment, a display device, includes a first substrate including a first conductive layer, a second substrate including a base having a first upper surface on a side opposite to a first lower surface opposed to the first substrate, a second conductive layer provided on the first upper surface, a third conductive layer provided on the first upper surface and electrically connected to the second conductive layer, a fourth conductive layer covering the third conductive layer and having a light-shielding property, a first through hole provided in the base, and an insulating material overlapping the connection material and having a light-shielding property.

13 Claims, 11 Drawing Sheets

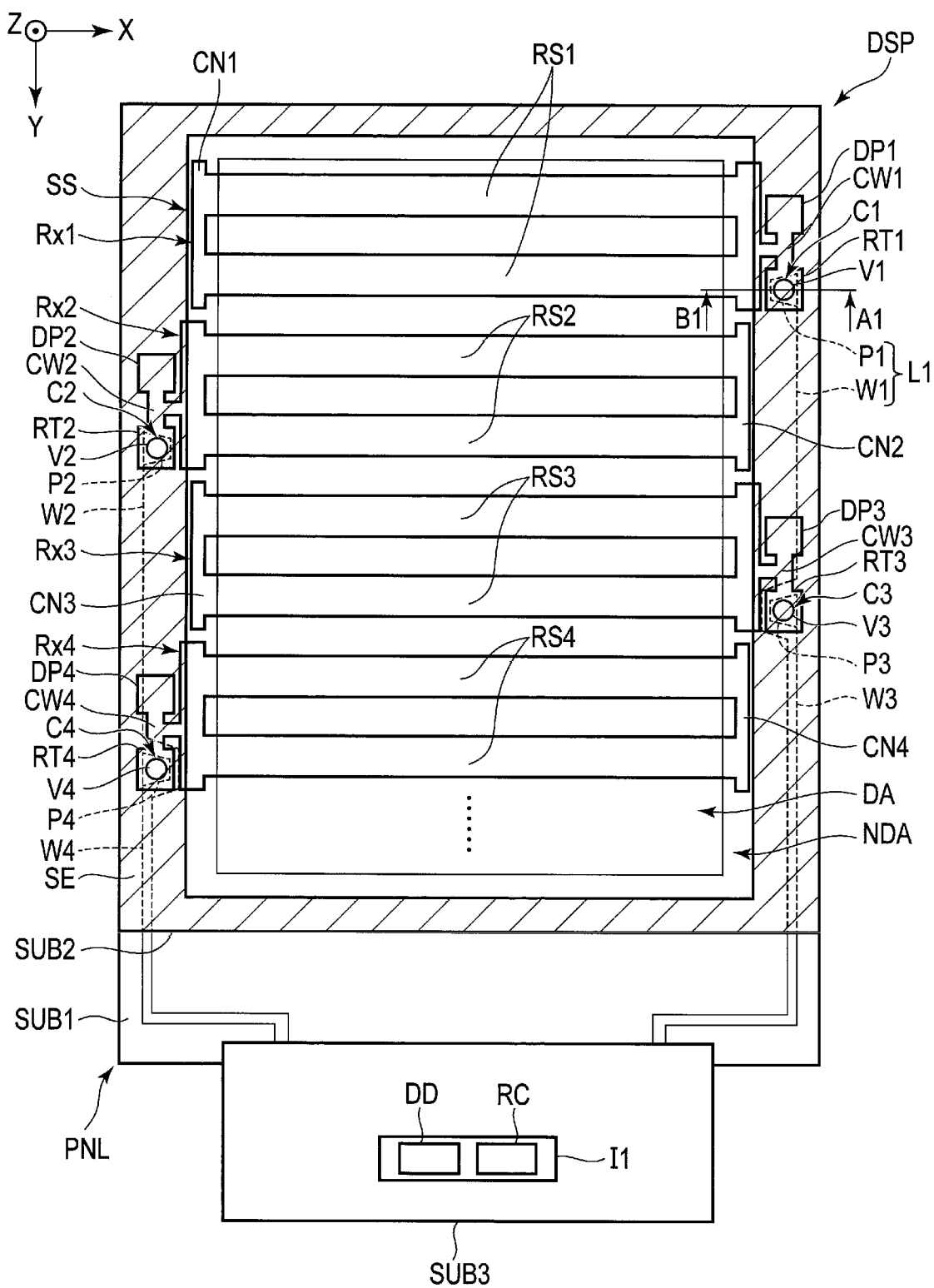
F I G. 1

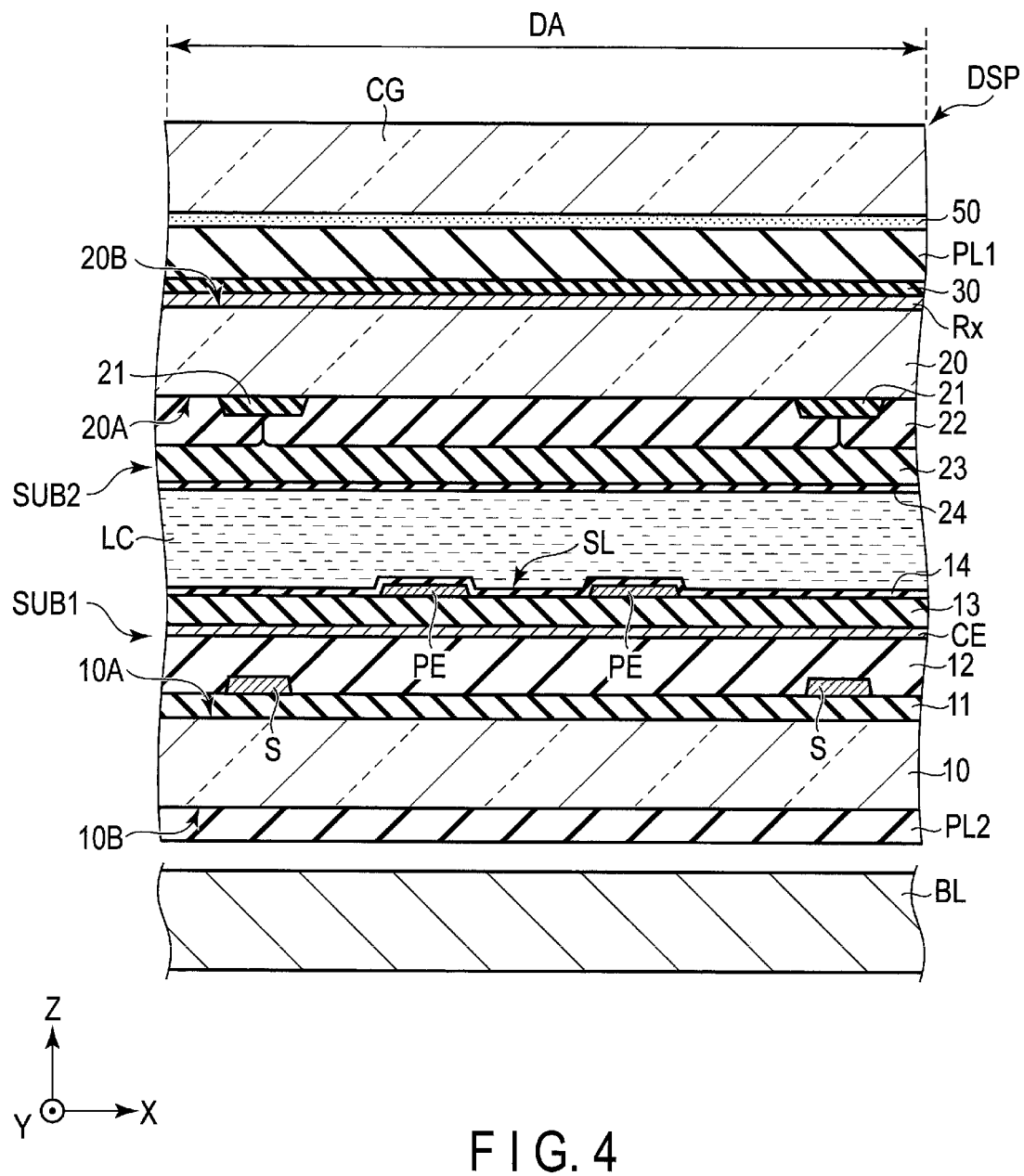
F I G. 4

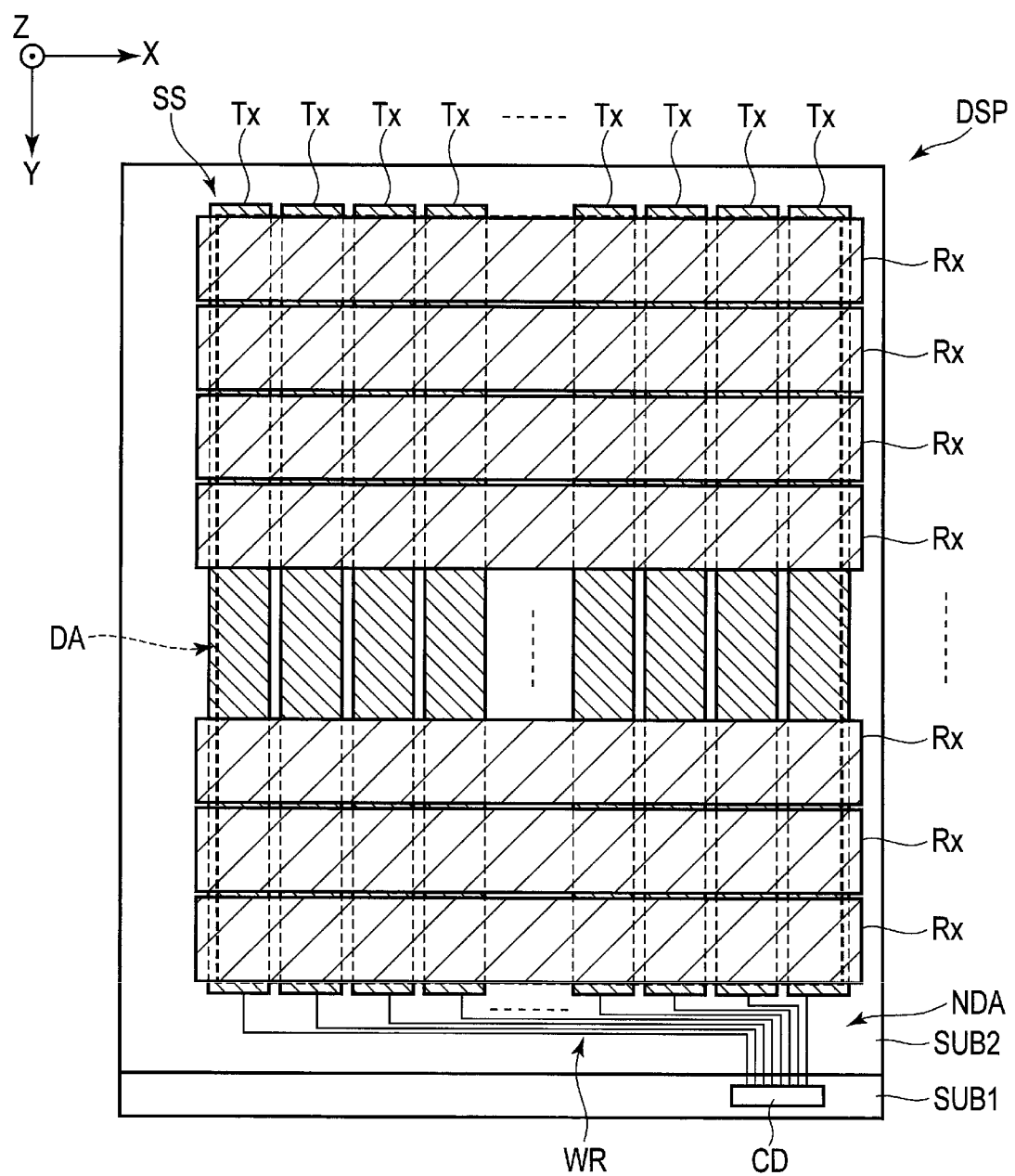
F I G. 5

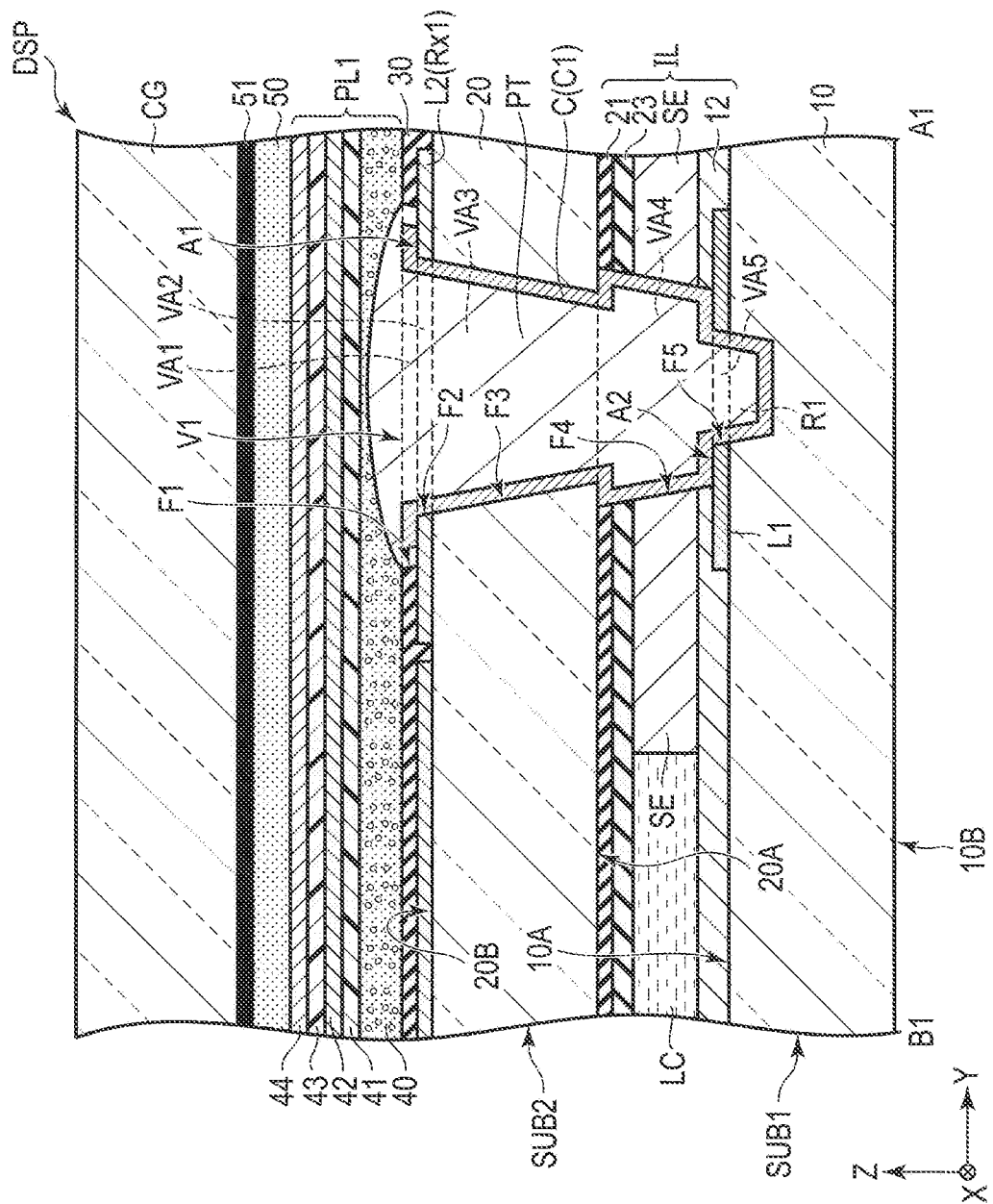
F I G. 6

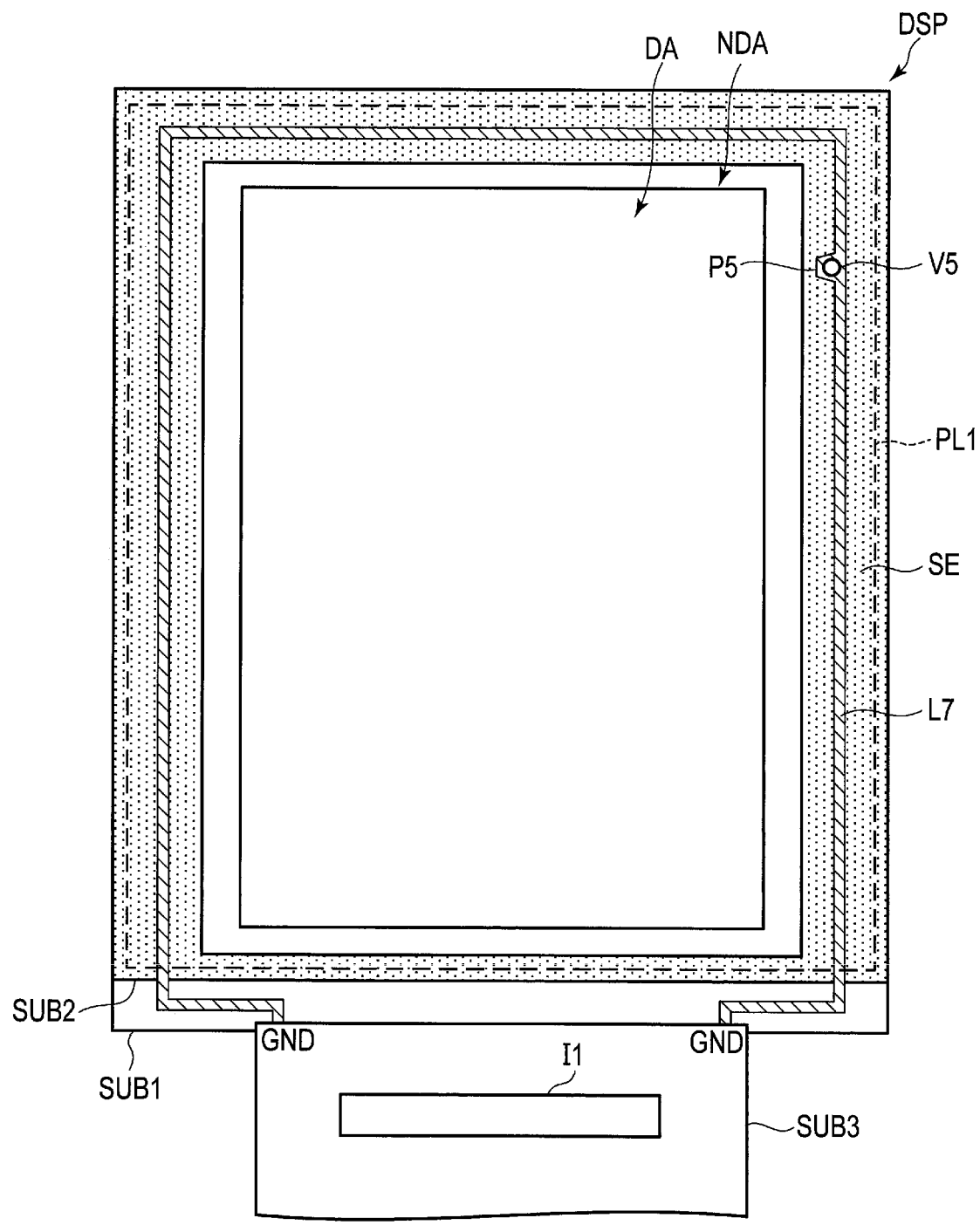
F I G. 11

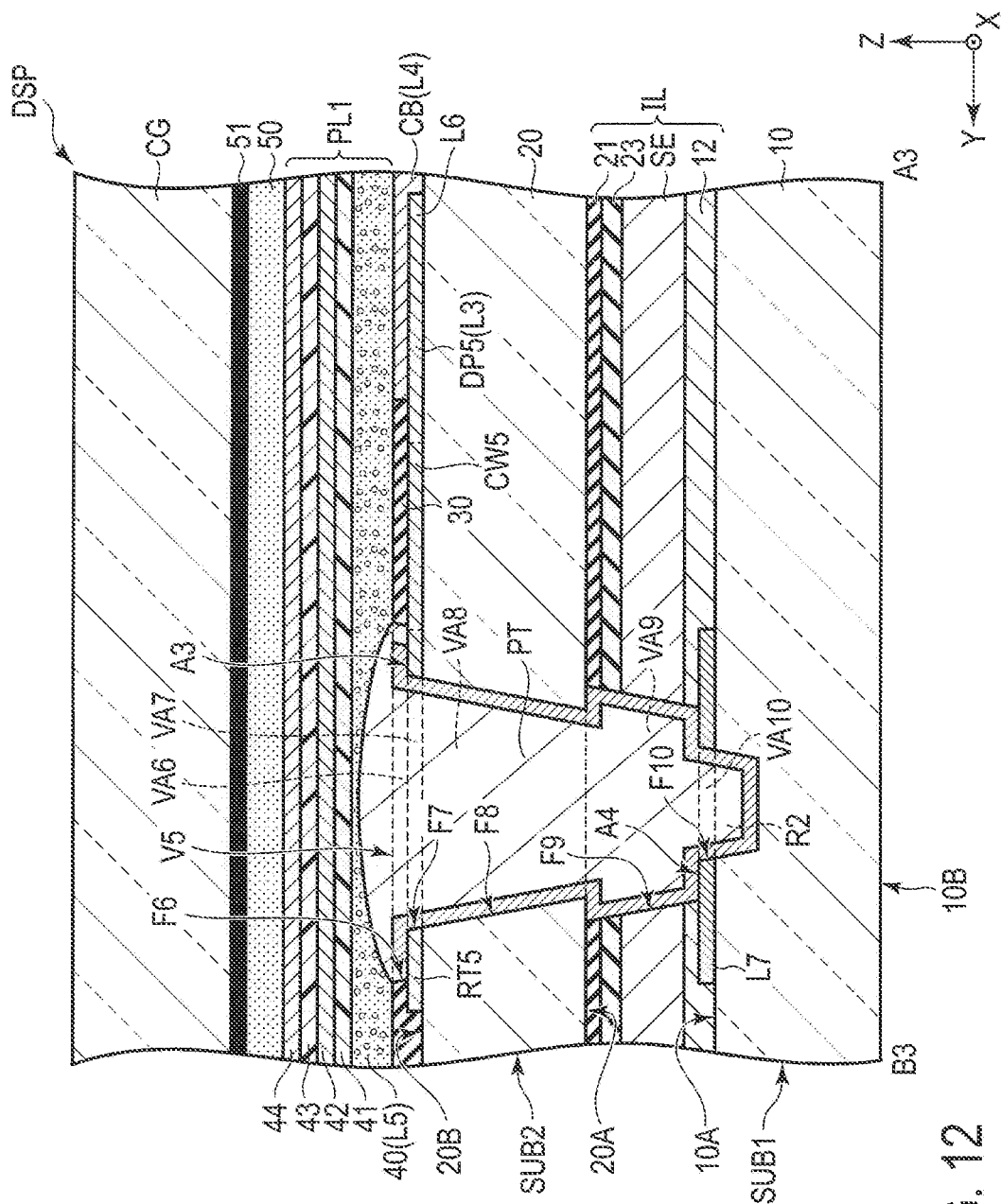
F I G. 12

_US 10,698,245 B2_

DISPLAY DEVICE

CROSS-REFERENCE TO RELATED APPLICATIONS

This application is based upon and claims the benefit of priority from Japanese Patent Application No. 2018-014655, filed Jan. 31, 2018, the entire contents of which are incorporated herein by reference.

FIELD

Embodiments described herein relate generally to a display device.

BACKGROUND

A liquid crystal display device is known as an example of display devices. The liquid crystal display device comprises an array substrate on which pixel electrodes and switching elements are formed, a counter-substrate opposed to the array substrate, and a liquid crystal layer disposed between the array substrate and the counter-substrate.

If the liquid crystal display device is touched from the counter-substrate side, static electricity is often stored in the counter-substrate. If electric field caused by the static electricity or electric field from the outside of the liquid crystal display device acts on the liquid crystal layer, alignment of the liquid crystal molecules may be disturbed and the display quality may be degraded. In addition, static electricity may be stored in the counter-substrate, in the procedure of manufacturing the liquid crystal display device, too. If the static electricity is discharged, various lines, circuits, and the like may be damaged and the manufacturing yield may be lowered.

To suppress the degradation in display quality and the lowering of the manufacturing yield, for example, a technology of providing a conductive layer on an outer surface of a counter-substrate and connecting the conductive layer and the grounded line of the array substrate by a conductive tape has been proposed. In this configuration, charging the counter-substrate can be prevented by the conductive layer and the electric field from the outside can be blocked.

SUMMARY

The present application generally relates to a display device.

According to one embodiment, a display device, includes a first substrate including a first conductive layer, a second substrate including a base having a first upper surface on a side opposite to a first lower surface opposed to the first substrate, a second conductive layer provided on the first upper surface, a third conductive layer provided on the first upper surface and electrically connected to the second conductive layer, a fourth conductive layer covering the third conductive layer and having a light-shielding property, a first through hole provided in the base, and an insulating material overlapping the connection material and having a light-shielding property.

BRIEF DESCRIPTION OF THE DRAWINGS

FIG. 1 is a plan view showing a configuration example of a display device according to a first embodiment.

FIG. 4 is a cross-sectional view schematically showing parts of the display device in a display area.

FIG. 5 is a plan view showing a configuration example of a sensor.

FIG. 6 is a schematic cross-sectional view showing parts of the display device cut along line A1-B1 in FIG. 1.

FIG. 11 is a schematic plan view showing the display device according to the second embodiment.

FIG. 12 is a schematic cross-sectional view showing parts of the display device according to the second embodiment.

DETAILED DESCRIPTION

Figure 2:
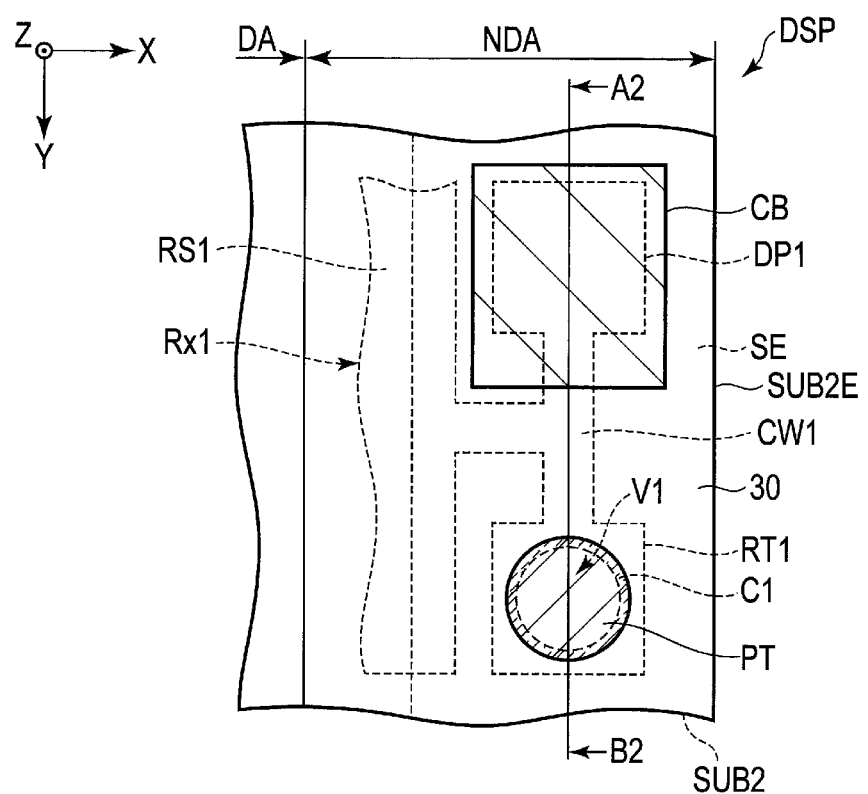
FIG. 2 is a plan view showing examples of a conductive layer, an overcoat layer, and a protection material.

In general, according to one embodiment, a display device, comprises: a first substrate including a first conductive layer; a second substrate including a base having a first lower surface opposed to the first substrate and a first upper surface on a side opposite to the first lower surface; a display function layer disposed between the first substrate and the second substrate; a second conductive layer provided on the first upper surface; a third conductive layer provided on the first upper surface and electrically connected to the second conductive layer; a fourth conductive layer covering the third conductive layer and having a light-shielding property; a first through hole provided in the base; a connection material electrically connecting the first conductive layer and the second conductive layer to each other; and an insulating material overlapping the first through hole and the connection material and having a light-shielding property, wherein the connection material is in contact with the first conductive layer and the second conductive layer through the first through hole.

According to another embodiment, a display device, comprises: a first substrate including a first conductive layer; a second substrate including a base having a first lower surface opposed to the first substrate and a first upper surface on a side opposite to the first lower surface; a display function layer disposed between the first substrate and the second substrate; a second conductive layer located on the first upper surface side; a third conductive layer located on the first upper surface side and electrically connected to the second conductive layer; a fourth conductive layer overlapping the third conductive layer and having a light-shielding property; a first through hole provided in the base; and a connection material electrically connecting the first conductive layer and the second conductive layer to each other, the connection material being in contact with the first conductive layer and the second conductive layer through the first through hole.

Various embodiments will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, and the like, of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In each of the embodiments, a liquid crystal display device is described as an example of the display device. The liquid crystal display device can be used for, for example, various devices such as a smartphone, a tablet terminal, a mobile telephone terminal, a notebook computer, a vehicle-mounted device, and a game console. The major configuration explained in each of the embodiments can also be applied to various display devices, for example, a self-luminous display device such as an organic electroluminescent display element, and the like, an electronic paper-type display device comprising an electrophoretic element, and the like, a display device employing micro-electromechanical systems (MEMS), or a display device employing electrochromism.

<First Embodiment>

FIG. 1 is a plan view showing a first configuration example of a display device DSP of the first embodiment. A liquid crystal display device on which a sensor SS is mounted will be explained as an example of the display device DSP. A first direction X, a second direction Y, and a third direction Z are orthogonal to each other but may intersect at an angle other than 90 degrees. The first direction X and the second direction Y correspond to directions parallel to a main surface of a substrate constituting the liquid crystal display device DSP, and the third direction Z corresponds to a thickness direction of the display device DSP. The length in the third direction Z is referred to as a thickness. A plan view of the display device DSP in an X-Y plane defined by the first direction X and the second direction Y is illustrated here. Viewing the X-Y plane from the third direction Z is defined as planar view in the following explanations.

The display device DSP comprises a display panel PNL, an IC chip I1, a wiring board SUB3, and the like. The display panel PNL is a liquid crystal display panel and comprises a first substrate SUB1, a second substrate SUB2, a sealant SE, and a display function layer (liquid crystal layer LC to be explained later). The second substrate SUB2 is opposed to the first substrate SUB1. The sealant SE corresponds to a portion represented by right-upward diagonal hatch lines in FIG. 1, and bonds the first substrate SUB1 and the second substrate SUB2. In the following explanations, a direction perpendicular to the X-Y plane, for example, a direction from the first substrate SUB1 to the second substrate SUB2 is called an upward direction (or, more simply, upwardly) and a direction from the second substrate SUB2 to the first substrate SUB1 is called a downward direction (or, more simply, downwardly).

The display panel PNL includes a display area DA on which an image is displayed and a frame-shaped non-display area NDA surrounding the display area DA. The display area DA is located on, for example, an inner side surrounded by the sealant SE. The seal SE is located in the non-display area NDA.

The IC chip I1 is mounted on the wiring substrate SUB3. The IC chip I1 is not limited to the example illustrated, but may be mounted on the first substrate SUB1 which extends to the outside from the second substrate SUB2 or may be mounted on an external circuit connected to the third substrate SUB3. The IC chip I1 incorporates, for example, a display driver DD which outputs a signal necessary for the image display. The display driver DD comprises at least some of a signal line drive circuit SD, a scanning line drive circuit GD, and a common electrode drive circuit CD, which will be explained later. In addition, in the example illustrated, the IC chip I1 incorporates a detection circuit RC which functions as a touch panel controller or the like. The detection circuit RC may be built in the other IC chip different from the IC chip I1.

A sensor SS executes sensing to detect contact or approach of the detected object to the display device DSP. The sensor SS comprises detection electrodes Rx (Rx1, Rx2, Rx3, Rx4, . . . ). Each of the detection electrodes Rx is provided on the second substrate SUB2. The detection electrodes Rx extend in the first direction X and are spaced apart and arranged in the second direction Y.

The detection electrodes Rx (Rx1, Rx2, Rx3, Rx4, . . . ) comprise detection portions RS (RS1, RS2, RS3, RS4, . . . ), terminal portions RT (RT1, RT2, RT3, RT4, . . . ), pads DP (DP1, DP2, DP3, DP4, . . . ), and connection portions CN (CN1, CN2, CN3, CN4, . . . ), respectively.

The detection portions RS are located in the display area DA and extend in the first direction X. In the detection electrodes Rx, the detection portions RS are mainly used for sensing. In the example illustrated, the detection portions RS are formed in a strip shape but, more specifically, formed of an assembly of thin metal wires. In the example illustrated, the each of the detection electrodes Rx comprises two detection portions RS but may comprise three or more detection portions RS or may comprise one detection portion RS.

The terminal portions RT are electrically connected to the detection portions RS, respectively. In the example illustrated, the terminal portions RT1, RT3, . . . of the odd-numbered detection electrodes Rx1, Rx3, . . . are located on a side portion (hereinafter called a first side portion) of the non-display area NDA in the first direction X. In addition, the terminal portions RT2, RT4, . . . of the even-numbered detection electrodes Rx2, Rx4, . . . are located on the other side portion (hereinafter called a second side portion) of the non-display area NDA in the first direction X, which is opposite to the first side portion. The terminal portions RT are located at the positions which overlap the sealant SE in planar view.

The pads DP are electrically connected to the terminal portions RT, respectively. In the example illustrated, the pads DP are electrically connected to the detection portions RS and the terminal portions RT via connection lines CW (CW1, CW2, CW3, CW4, . . . ). The pads DP1, DP3, . . . of the odd-numbered detection electrodes Rx1, Rx3, . . . are located on the first side portion. In addition, the pads DP2, DP4, . . . of the even-numbered detection electrodes Rx2, Rx4, . . . are located on the second side portion. The pads DP may be formed independently of the detection electrodes Rx. In addition, the pads DP may be connected directly to the detection portions RS. Each of the pads DP may be formed in a shape other than a square, for example, a circle, an ellipse or a polygon in planar view. The pads DP are, for example, inspection pads for inspecting conduction between the detection electrodes Rx and pads P to be explained later.

In contrast, the first substrate SUB1 comprises pads P (P1, P2, P3, P4, . . . ) and lines W (W1, W2, W3, W4, . . . ). In the example illustrated, the odd-numbered pads P1, P3, . . . and the lines W1, W3, . . . are located on the first side portion of the non-display area NDA. In addition, the even-numbered pads P2, P4, . . . and the lines W2, W4, . . . are located on the second side portion of the non-display area NDA. The pads P and the lines W overlap the sealant SE in planar view. The pads P are formed at positions which superpose the corresponding terminal portions RT, respectively, in planar view. In the example illustrated, the pads P are formed in a trapezoidal shape in planar view. Each of the pads P may be formed in a shape other than a trapezoid, for example, a polygon, a circle, or an ellipse in planar view. The lines W are connected to the pads P, extend in the second direction Y, and are electrically connected to the detection circuit RC of the IC chip I1 via the third substrate SUB3. The pads P, the lines W, and the wiring substrate SUB3 may have a configuration taking a measure against static electricity, for example, a configuration to which the ground potential (GND) is applied.

As illustrated, in the layout that the pad P3 is disposed at a position closer to the third substrate SUB3 than the pad P1 in the second direction Y, the line W1 bypasses the inside of the pad P3 in the first direction X (i.e., the direction in which the display area DA is provided), and is arranged parallel to the line W3 inside the line W3, between the pad P3 and the third substrate SUB3. Similarly, the line W2 bypasses the inside of the pad P4 in the first direction X, and is arranged parallel to the line W4 inside the line W4, between the pad P4 and the third substrate SUB3.

Plural holes for connection (connection holes) V (V1, V2, V3, V4, . . . ) are formed at positions where the terminal portions RT (RT1, RT2, RT3, RT4, . . . ) and the pads P (P1, P2, P3, . . . ) are opposed. In addition, the connection holes V can be formed to penetrate the second substrate SUB2 including the terminal portions RT and the sealant SE and to penetrate to the pads P. In the example illustrated, the connection holes V are shaped in a circle in planar view, but the shape is not limited to the example illustrated and may be an ellipse or the other shape. Connection materials C (C1, C2, C3, C4, . . . ) are provided in the connection holes V, respectively. The connection materials C are electrically connected to the terminal portions RT and the pads P. In other words, the detection electrodes Rx provided on the second substrate SUB2 are electrically connected to the detection circuit RC of the third substrate SUB3 connected to the pads P of the first substrate SUB1 via the connection materials C. The detection circuit RC reads sensor signals output from the detection electrodes Rx and detects contact or approach of the detected object, position coordinates of the detected object, and the like. The pads are often called a first conductive layer and the detection electrodes Rx are often called a second conductive layer in the following descriptions. The first substrate SUB1 may be configured to prevent static electricity flowing from the second substrate SUB2 via the connection holes V. For example, the first substrate SUB1 may have a configuration to which the ground potential is applied as a measure against static electricity flowing from the second substrate SUB2 via the connection holes V.

According to the layout of the above-explained display device DSP, the width of the first side portion and the width of the second side portion can be made uniform, which is desirable for narrowing the frame.

FIG. 2 is a plan view showing examples of a conductive layer CB, an overcoat layer 30, and a protection material PT.

The pad DP1 and the terminal portion RT1 of the detection electrode Rx1 illustrated in FIG. 1 will be explained, but the same configuration as the pad DP1 and the terminal portion RT1 can be applied to the other pads DP and the terminal portions RT.

The display device DSP further comprises an overcoat layer 30 which protects the detection electrode Rx, a conductive layer CB which protects the pad DP, and a protection material PT which protects the connection material C. In the example illustrated, the overcoat layer 30 overlaps most parts of the detection electrode Rx in planar view. The overcoat layer 30 does not overlap the pad DP1, the connection hole V1, and the connection material C1. The conductive layer CB overlaps the pad DP5 and a part of the connection line CW. The conductive layer CB is located in the non-display area NDA and is larger than the pad DP1 in planar view. In addition, the width of the conductive layer CB can be formed to be smaller than a distance between an end portion SUB2E of the second substrate SUB2 and the display area DA, in the first direction X. The conductive layer CB is formed of a conductive material having a light-shielding property, for example, a black conductive material. The conductive layer CB is formed of a material including carbon as its main component, for example, carbon black. In the example illustrated, the conductive layer CB is formed in a square shape, but the shape is not limited to a square. For example, the conductive layer CB may be formed in a shape of a circle, an ellipse, or a polygon. In addition, the conductive layer CB may be the same in size as the pad DP1 in planar view. The conductive layer CB may overlap at least the pad DP1 in planar view. For example, the conductive layer CB overlaps the whole pad DP1. The protective material PT overlaps the connection hole V1 and the connection material C1. In the example illustrated, the protection material PT is formed in a circular shape in planar view but the shape may not be a circle. For example, the protection material PT may be formed in a shape of a circle, or a polygon. The protection material PT is formed of an insulating material having a light-shielding property, for example, a black organic insulating material. The protection material PT is formed of, for example, titanium nitride (Titan Black: Registered trademark). The overcoat layer 30, the conductive layer CB, and the protection material PT will be explained later.

Figure 3:
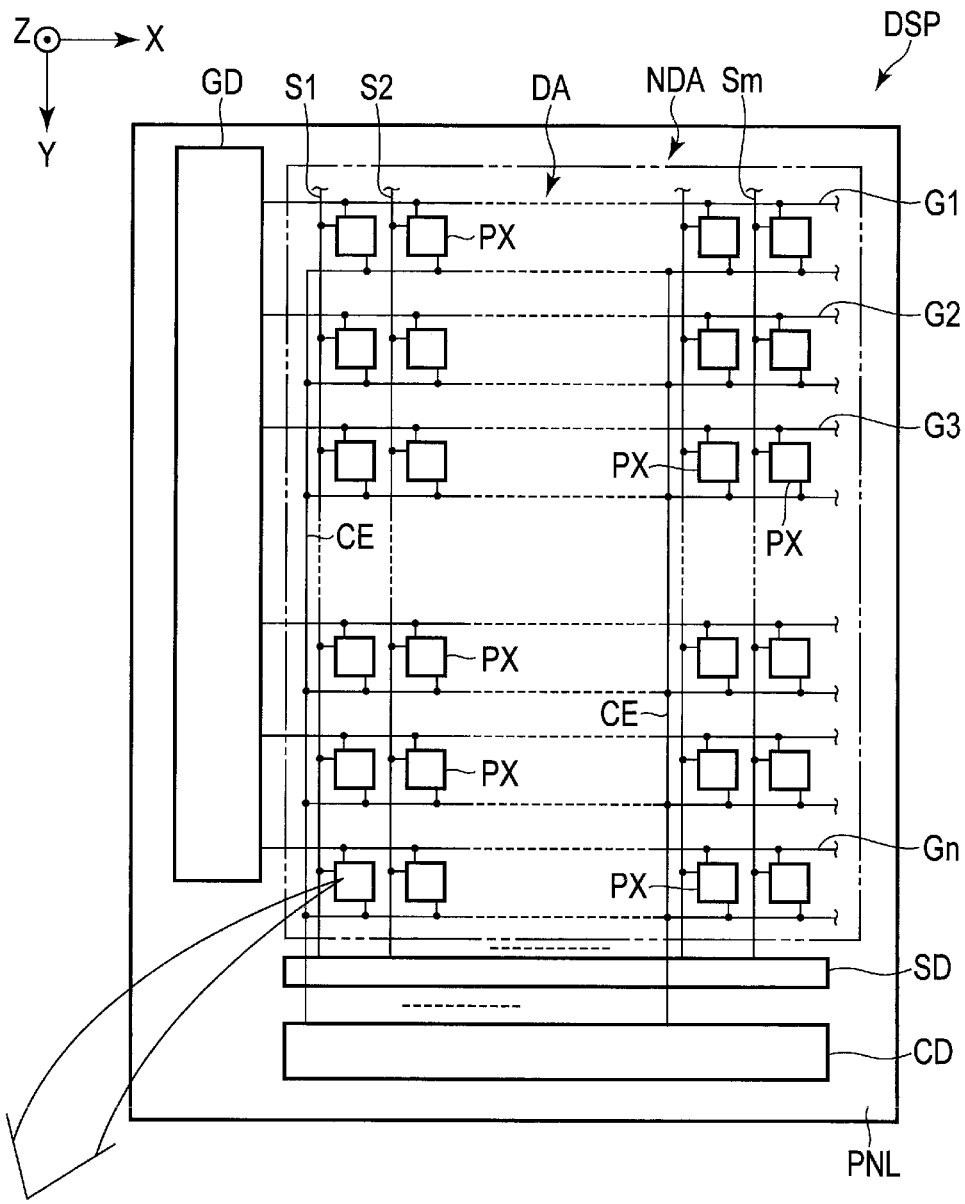
FIG. 3 is a diagram showing a basic configuration and an equivalent circuit, of the display panel shown in FIG. 1.
Figure 3:
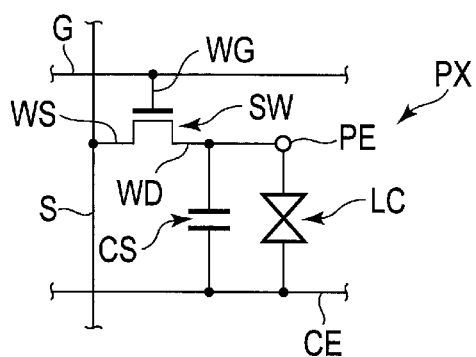

FIG. 3 is a diagram showing a basic configuration and an equivalent circuit, of the display panel PNL shown in FIG. 1.

The display panel PNL includes plural pixels PX in the display area DA. The pixel indicates a minimum portion capable of being independently controlled in accordance with the pixel signal and, for example, exists in an area including a switching element disposed at a position where a scanning line and a signal line to be explained later intersect. The pixels PX are arrayed in a matrix in the first direction X and the second direction Y. In addition, the display panel PNL includes plural scanning lines G (G1 to Gn), plural signal lines S (S1 to Sm), a common electrode CE, and the like, in the display area DA. The scanning lines G extend in the first direction X and are arranged in the second direction Y. The signal lines S extend in the second direction Y and are arranged in the first direction X. Each of the scanning lines G and the signal lines S are formed of a metal material such as molybdenum, tungsten, titanium, or aluminum, or their alloy material, and may be formed to have a single-layer structure or a multilayer structure. The scanning lines G and the signal lines S may not extend linearly, but part of the lines may be bent. The common electrode CE is disposed over the pixels PX. The scanning lines the signal lines S, and the common electrode CE are drawn to the non-display area NDA. In the non-display area NDA, the scanning lines G are connected to the scanning line drive circuit GD, the signal lines S are connected to the signal line drive circuit SD, and the common electrode CE is connected to the common electrode drive circuit CD. The signal line drive circuit SD, the scanning line drive circuit GD, and the common electrode drive circuit CD may be formed on the first substrate SUB1 or several or all parts of the circuits may be built in the driving IC chip I1 shown in FIG. 1.

Each pixel PX comprises a switching element SW, a pixel electrode PE, the common electrode CE, a liquid crystal layer LC, and the like. The switching element SW is composed of, for example, a thin-film transistor (TFT), and is electrically connected to the scanning line G and the signal line S. More specifically, the switching element SW comprises a gate electrode WG, a source electrode WS, and a drain electrode WD. The gate electrode WG is electrically connected to the scanning line G In the example illustrated, the electrode electrically connected to the signal line S is referred to as the source electrode WS, and the electrode electrically connected to the pixel electrode PE is referred to as the drain electrode WD. The common electrode CE and the pixel electrodes PE are formed of, for example, a transparent conductive material such as indium tin oxide (ITO) or indium zinc oxide (IZO).

The scanning line G is connected to the switching elements SW of the respective pixels PX arranged in the first direction X. The signal line S is connected to the switching elements SW of the respective pixels PX arranged in the second direction Y. Each pixel electrode PE is opposed to, for example, the common electrode CE, and drives the liquid crystal layer LC by an electric field produced between the pixel electrode PE and the common electrode CE. A storage capacitor CS is formed, for example, between the common electrode CE and the pixel electrode PE.

FIG. 4 is a cross-sectional view schematically showing several parts of the display device DSP in the display area DA. The figure illustrates a cross-section of the display device DSP cut along the first direction X. The illustrated display device DSP is configured to correspond to the display mode mainly using the lateral electric field approximately parallel to the main surface of the substrate. The display device DSP may be configured to correspond to a display mode which uses a longitudinal electric field perpendicular to the main surface of the substrate, an electric field inclined to the main surface of the substrate, or a combination of the electric fields. In the display mode using the lateral electric field, for example, either of the first substrate SUB1 and the second substrate SUB2 can be configured to comprise both the pixel electrode PE and the common electrode CE. In the display mode using the longitudinal electric field or the oblique electric field, for example, a configuration in which the first substrate SUB1 comprises either of the pixel electrode PE and the common electrode CE and the second substrate SUB2 comprises the other electrode can be employed. It should be noted that the main surface of the substrate is a surface parallel to the X-Y plane.

The first substrate SUB1 comprises a first base 10 (first insulating substrate), the signal lines S, the common electrode CE, the pixel electrode PE, a first insulating layer 11, a second insulating layer 12, a third insulating layer 13, a first alignment layer 14, and the like. Illustration of the above-explained switching elements SW, scanning lines various insulating layers interposed between them is omitted.

The first base 10 is formed of, for example, alkali-free glass and includes an upper surface 10A (first surface 10A) opposed to the second surface SUB2 and a lower surface 10B (second surface 10B) on a side opposite to the upper surface 10A. The first insulating layer 11 is disposed on the upper surface 10A. The signal lines S are disposed on the first insulating layer 11. The second insulating layer 12 is disposed on the signal lines S and the first insulating layer 11. The common electrode CE is disposed on the second insulating layer 12. The third insulating layer 13 is disposed on the common electrode CE. The pixel electrode PE is disposed on the third insulating layer 13. The pixel electrode PE is opposed to the common electrode CE via the third insulating layer 13. In the example of FIG. 4, the pixel electrode PE includes a slit SL. However, the pixel electrode PE may include more slits SL or may not include the slit SL. The first alignment layer 14 covers the pixel electrode PE and the third insulating layer 13. For example, the first insulating layer 11 and the third insulating layer 13 are inorganic insulating layers, and the second insulating layer 12 is an organic insulating layer.

The configuration of the first substrate SUB1 is not limited to the example illustrated, but the pixel electrodes PE may be located between the second insulating layer 12 and the third insulating layer 13, and the common electrode CE may be located between the third insulating layer 13 and the first alignment layer 14. In addition, both the pixel electrode PE and the common electrode CE may be formed in a comb tooth shape and disposed in the same layer to be engaged with each other.

The second substrate SUB2 comprises a second base 20 (second insulating substrate), a light-shielding layer 21, a color filter 22, an overcoat layer 23, a second alignment film 24, and the like.

The second base 20 is formed of, for example, alkali-free glass and includes a lower surface 20A (first surface 20A) opposed to the first surface SUB1 and an upper surface 20B (second surface 20B) on a side opposite to the lower surface 20A. The light-shielding layer 21 and the color filter 22 are disposed under the lower surface 20A. The light-shielding layer 21 sections the pixels and is located just above the signal lines S.

The color filter 22 is opposed to the pixel electrode PE, and partially overlaps the light shielding layer 21. The color filter 22 includes a red color filter, a green color filter, a blue color filter, and the like. The overcoat layer 23 covers the color filter 22. The second alignment layer 24 covers the overcoat layer 23. The liquid crystal layer LC is disposed between the first alignment layer 14 and the second alignment layer 24. The color filter 22 may be disposed on the first substrate SUB1. The color filter 22 may include color filters of four or more colors. On the pixel displaying white color, a white color filter or an uncolored resin material may be disposed, or the overcoat layer may be disposed without the color filters.

The detection electrode Rx is located on the side of the main surface 20B of the second base 20. In the example illustrated, the detection electrode Rx is in contact with the upper surface 20B of the second base 20. The detection electrode Rx may be formed of a conductive layer including a metal, for example, a transparent conductive material such as ITO or IZO, and a transparent conductive layer may be deposited on a conductive layer including a metal or may be formed of a conductive organic material, a dispersing element of a fine conductive material, or the like. The overcoat layer (protective layer) 30 is in contact with an upper surface of the detection electrode Rx to cover most parts of the upper surface of the detection electrode Rx. The overcoat layer 30 is formed of, for example, an organic insulating material.

The display device DSP further comprises a cover member CG, an illumination device BL, a first polarizer PL1, and a second polarizer PL2.

The first polarizer PL1 is located on the side of the upper surface 20B. In the example illustrated, the first polarizer PL1 is located between the cover member CG and the detection electrode Rx. The first polarizer PL1 is bonded to the overcoat layer 30. The cover member CG is stuck on the first polarizer PL1 via an adhesive layer 50. The cover member CG is formed of, for example, glass, but may be formed of a material other than glass. The second polarizer PL2 is located on the side of the lower surface 10B. In the example illustrated, the second polarizer PL2 is located between the first substrate SUB1 and the illumination device BL. The second polarizer PL2 is in contact with the lower surface 10B. Each of the polarizers PL1 and PL2 faces at least the whole display area DA. The display device DSP may further comprise optical elements such as retardation films between the cover member CG and the second substrate SUB2 and between the first substrate SUB1 and the illumination device BL. In addition, various insulating layers and various conductive layers may be disposed between the second polarizer PL2 and the detection electrode Rx.

The display device DSP shown in FIG. 4 is an application example of a transmissive structure which displays an image by urging the light from the illumination device BL to be selectively transmitted. The display device DSP is not limited to this example, but may be a reflective display device which displays an image by selectively reflecting the light from an upper side of the second substrate SUB2 or a transflective display device comprising the functions of the transmissive display device and the reflective display device.

FIG. 5 is a plan view showing a configuration example of the sensor SS.

In the example shown in FIG. 5, the sensor SS comprises sensor drive electrodes Tx and the detection electrodes Rx. In FIG. 5, the sensor drive electrodes Tx correspond to portions represented by right-downward diagonal hatch lines and are provided on the first substrate SUB1. In addition, the detection electrodes Rx correspond to portions represented by right-upward diagonal hatch lines and are provided on the second substrate SUB2. The sensor drive electrodes Tx and the detection electrodes Rx intersect each other in X-Y plane. The detection electrodes Rx are opposed to the sensor drive electrodes Tx in the third direction Z.

The sensor drive electrodes Tx and the detection electrodes Rx are located in the display area DA and are partially elongated to the non-display area NDA. In the example illustrated, the sensor drive electrodes Tx are formed in a strip shape elongated in the second direction Y, and are arranged to be spaced apart from each other in the first direction X. The detection electrodes Rx extend in the first direction X, and are arranged to be spaced apart from each other in the second direction Y. As explained with reference to FIG. 1, the detection electrodes Rx are connected to the pads P provided on the first substrate SUB1 and are electrically connected to the detection circuit RC via the lines. Each of the sensor drive electrodes Tx is electrically connected to the common electrode drive circuit CD via a line WR. The number, size, and shape of the sensor drive electrodes Tx and the detection electrodes Rx are not particularly limited but can be changed variously.

The sensor drive electrode Tx includes the above-explained common electrode CE, comprises a function of producing an electric field between the sensor drive electrode Tx and the pixel electrode PE, and also has a function of detecting a position of an object to be detected by producing a capacitance between the sensor drive electrode Tx and the detection electrode Rx.

The common electrode drive circuit CD supplies a common drive signal to the sensor drive electrode Tx including the common electrode CE in the display drive to display an image in the display area DA. In addition, the common electrode drive circuit CD supplies a sensor drive signal to the sensor drive electrode Tx in the sensing drive to execute sensing. Each of the detection electrodes Rx outputs a sensor signal necessary for sensing (i.e., a signal based on a change in the inter-electrode capacitance between the sensor drive electrode Tx and the detection electrode Rx) in accordance with supply of the sensor drive signal to the sensor drive electrode Tx. The detection signal output from the detection electrode Rx is input to the detection circuit RC shown in FIG. 1.

The sensor SS in the above-explained configuration example is not limited to a mutual-capacitive sensor which detects an object based on a change in the electrostatic capacitance between a pair of electrodes (in the above example, the electrostatic capacitance between the sensor drive electrode Tx and the detection electrode Rx), but may be a self-capacitive sensor which detects an object based on a change in the electrostatic capacitance of the detection electrode Rx.

FIG. 6 is a schematic cross-sectional view showing several parts of the display device DSP cut along line A1-B1 in FIG. 1. Illustration of the elements provided on the first substrate SUB1 and the second substrate SUB2 shown in FIG. 4, the illumination device BL, and the second polarizer PL2 is omitted as needed. The display device will be explained below by using the connection hole V1, but the same configuration of the connection hole V1 can be applied to the other connection holes V.

The first substrate SUB1 and the second substrate SUB2 are stuck on each other by a sealant SE. The sealant SE is formed in, for example, an annular shape surrounding the display area DA as shown in FIG. 1. In the example shown in FIG. 6, the second insulating layer 12 is disposed between the sealant SE and the first base 10, and the light-shielding layer 21 and the overcoat layer 23 are disposed between the sealant SE and the second base 20. For example, an insulating layer IL which is an organic insulating layer is composed of the sealant SE, the second insulating layer 12, the light-shielding layer 21, and the overcoat layer 23. The insulating layer IL may include an inorganic insulating layer. The insulating layer IL may be hereinafter referred to as an interlayer insulating layer IL.

The insulating layer IL may further include the first alignment layer 14, the second alignment layer 24, and the like shown in FIG. 4. In addition, the insulating layer IL may not include at least one of the second insulating layer 12, the overcoat layer 23, and the light-shielding layer 21. The insulating layer IL may include the other layers.

The first substrate SUB1 comprises the first conductive layer L1. In the example illustrated in FIG. 6, the first conductive layer L1 is formed on the upper surface 10A of the first base 10 and is covered with the second insulating layer 12. In examples including the present example, various insulating layers and various conductive layers may be disposed between the first conductive layer L1 and the first base 10 and between the first conductive layer L1 and the second insulating layer 12. The first conductive layer L1 is formed of, for example, a metal material such as molybdenum, tungsten, titanium, aluminum, silver, copper or chromium or an alloy formed by a combination of these metal materials or may be formed of a transparent conductive material such as ITO or IZO. The first conductive layer L1 may have a single-layer structure or a multilayer structure.

A second conductive layer L2 is located on the side of the upper surface 20B of the second base 20. In the example illustrated, the second conductive layer L2 is covered with the overcoat layer 30. In addition, the second conductive layer L2 is in contact with the upper surface 20B of the second base 20. In the example illustrated, the second conductive layer L2 corresponds to the detection electrode Rx1 shown in FIG. 1. The second conductive layer L2 is formed of, for example, a metal material such as molybdenum, tungsten, titanium, aluminum, silver, copper or chromium or an alloy formed by a combination of these metal materials or may be formed of a transparent conductive material such as ITO or IZO. The second conductive layer L2 may have a single-layer structure or a multilayer structure. Various insulating layers and various conductive layers may be disposed between the second conductive layer L2 and the upper surface 20B. Various insulating layers and various conductive layers may also be disposed between the overcoat layer 30 and the second conductive layer L2. The overcoat layer 30 is located between the first polarizer PL1 and the second polarizer L2.

The first polarizer PL1 comprises an adhesive layer 40, a protective layer 41, a polarizing layer 42, a protective layer 43, and a coating layer 44. In the example illustrated in FIG. 6, the first polarizer PL1 is bonded to the overcoat layer 30 by the adhesive layer 40. Various insulating layers and various conductive layers may be disposed between the adhesive layer 40 and the overcoat layer 30.

The polarizing layer 42 is formed of, for example, polyvinyl alcohol (PVA) serving as its main component, and absorbs a specific polarization component of the light and allows the other polarization components to be transmitted. The protective layer 41 and the protective layer 43 are formed of, for example, triacetylcellulose (TAC). The protective layer 41 and the protective layer 43 protect the polarizing layer 42 on both sides through the polarizing layer 42. The coating layer 44 is a layer comprising an appropriate function in accordance with its purpose. For example, a hard-coating layer (HC), an anti-glare layer (AG), an antireflective layer (AR), a low reflective layer (LR), or the like can be employed as the coating layer 44. The second polarizer PL2 has the same configuration as the above-explained configuration of the first polarizer PL1.

In the present embodiment, the adhesive layer 40 is a conductive and adhesive layer having conductivity. For example, conductivity can be imparted to the adhesive layer 40 by mixing adhesive layer 40 with an organic conductive material. The coating layer 44 is formed over the whole region between the first polarizer PL1 and the overcoat layer 30. The adhesive layer 40 is therefore opposed to the whole region of the display area DA.

The overcoat layer 30 includes a through hole VA1. The second conductive layer L2 includes a through hole VA2 which communicates with the through hole VA1. The second base 20 includes a through hole VA3 which penetrates the lower surface 20A and the upper surface 20B and communicates with the through holes VA1 and VA2. The insulating layer IL includes a through hole VA4 which penetrates the lower surface 20A and the upper surface 10A and communicates with each of the through holes VA1, VA2, and VA3. The first conductive layer L1 includes a through hole VA5 which communicates with each of the through holes VA1 to VA4. In addition, the first base 10 includes a recess portion R1 which communicates with each of the through holes VA1 to VA5, on the upper surface 10A. In the example illustrated, the through holes VA1 to VA5 and the recess portion R1 are located in the non-display area NDA. The through hole VA4 penetrates the layers constituting the insulating layer IL, i.e., the sealant SE, the second insulating layer 12, the light-shielding layer 21, and the overcoat layer 23 in the example shown in FIG. 6.

The recess portion R1 is formed from the upper surface 10A to the lower surface 10B but does not penetrate up to the lower surface 10B in the example illustrated. For example, the depth of the recess portion R1 in the third direction Z is approximately one fifth to half as much as the thickness of the first base 10 in the third direction Z. The first base 10 may include a through hole which penetrates between the upper surface 10A and the lower surface 10B instead of the recess portion R1.

The through holes VA1 to VA5 and the recess portion R1 are located in the same straight line along the third direction Z with their hole centers positioned to coincide with one another in planar view, and constitute the connection hole V1. Each of the through holes VA1 to VA5 and the recess portion R1 is shaped in, for example, a regular circle in planar view but the shape may be the other shape such as an ellipse. The connection hole V1 may be composed of at least one of the through holes VA1 to VA5 and the recess portion R1 located in the same straight line along the third direction.

In the example illustrated in FIG. 6, the width (inner diameter) of each of the through holes VA1 to VA5 becomes smaller in the downward direction. That is, an inner surface F1 of the through hole VA1, an inner surface F2 of the through hole VA2, an inner surface F3 of the through hole VA3, an inner surface F4 of the through hole VA4, and an inner surface F5 of the through hole VA5 is tapered to the third direction Z. In the example illustrated in FIG. 6, a cross-section of each of the inner surfaces F1 to F5 has a linear shape but may be curved. In addition, the width (inner diameter) of each of the through holes VA1 to VA5 may be smaller to the upward direction or the width may be constant (i.e., the each of the inner surfaces F1 to F5 may be parallel to the third direction Z).

The width of the through hole VA2 is larger than the width of the through hole VA1 in the vicinity to the boundary between the through holes VA1 and VA2. The second conductive layer L2 thereby includes the first region A1 exposed from the overcoat layer 30 in the surrounding of the through hole VA2. For example, the shape of the first region A1 in planar view is an annular shape surrounding the whole periphery of the through hole VA2. However, the first region A1 may be provided at part of the surrounding of the through hole VA2 or plural first regions A1 may be provided intermittently.

The width of the through hole VA4 is larger than the width of the through hole VA5 in the vicinity to the boundary between the through holes VA4 and VA5. The first conductive layer L1 thereby includes the second region A2 exposed from the insulating layer IL in the surrounding of the through hole VA5. For example, the shape of the second region A2 in planar view is an annular shape surrounding the whole periphery of the through hole VA5. However, the second region A2 may be provided at part of the surrounding of the through hole VA5 or plural second regions A2 may be provided intermittently.

The display device DSP further comprises a connection material C which electrically connects the first conductive layer L1 to the second conductive layer L2 through the through holes VA2 to VA5. In the example illustrated in FIG. 6, the connection material C corresponds to the connection material C1 illustrated in FIG. 1. The connection material C sequentially covers the inner surfaces F1 to F5 of the through holes VA1 to VA5, the inner surface of the recess portion R1, the first region A1, and the second region A2 without interruption. For example, the connection material C desirably includes a metal material such as silver, which contains fine particles having a grain size of order in a range from several nanometers to several tens of nanometers.

The connection material C is in contact with not only the inner surface F5 of the through hole VA5, but also the first conductive layer L1 in the second region A2. The contact area can be thereby increased as compared with a case where the connection material C is in contact with the only inner surface F5, and the reliability in conduction is increased. In addition, the connection material C is in contact with not only the inner surface F2 of the through hole VA2, but also the second conductive layer L2 in the first region A1. The contact area can be thereby increased as compared with a case where the connection material C is in contact with the only inner surface F2, and the reliability in conduction is increased.

The inside of the connection material C is filled with the protection material PT serving as an insulating material having a light-shielding property. In the example illustrated, the protection material PT also covers the end portion of the connection material C located in the first region A1. Part of the protection material PT covers the through hole VA1 and protrudes above the through hole VA1. The protection material PT may not protrude from the through hole VAL The protection material PT prevents the portions exposed to the connection hole V1 and the connection material C from being corrosive due to moisture entering from the outside or the like. Furthermore, the protection material PT prevents occurrence of unevenness which results from the connection hole V1.

An upper surface of the protection material PT is covered with the adhesive layer 40 of the first polarizer PL1. A lower surface of the first polarizer PL1 is bonded to the overcoat layer 30 and the protection material PT via the adhesive layer 40. An upper surface of the first polarizer PL1 is bonded to the cover member CG via the adhesive layer 50. Since the cover member CG is thus provided, the vicinity to the connection hole V1 is sufficiently protected even if the strength of the second substrate SUB2 or the like is reduced due to the formation of the connection hole V1.

The cover member CG comprises, for example, a decorative layer 51 (light-shielding layer) on a surface of the side opposite to the second polarizer PL2. The decorative layer 51 is opposed to the non-display area NDA and is opened in accordance with the above-explained shape of the display area DA. The connection hole V1 cannot be visually recognized from the outside by the decorative layer 51.

Figure 7:
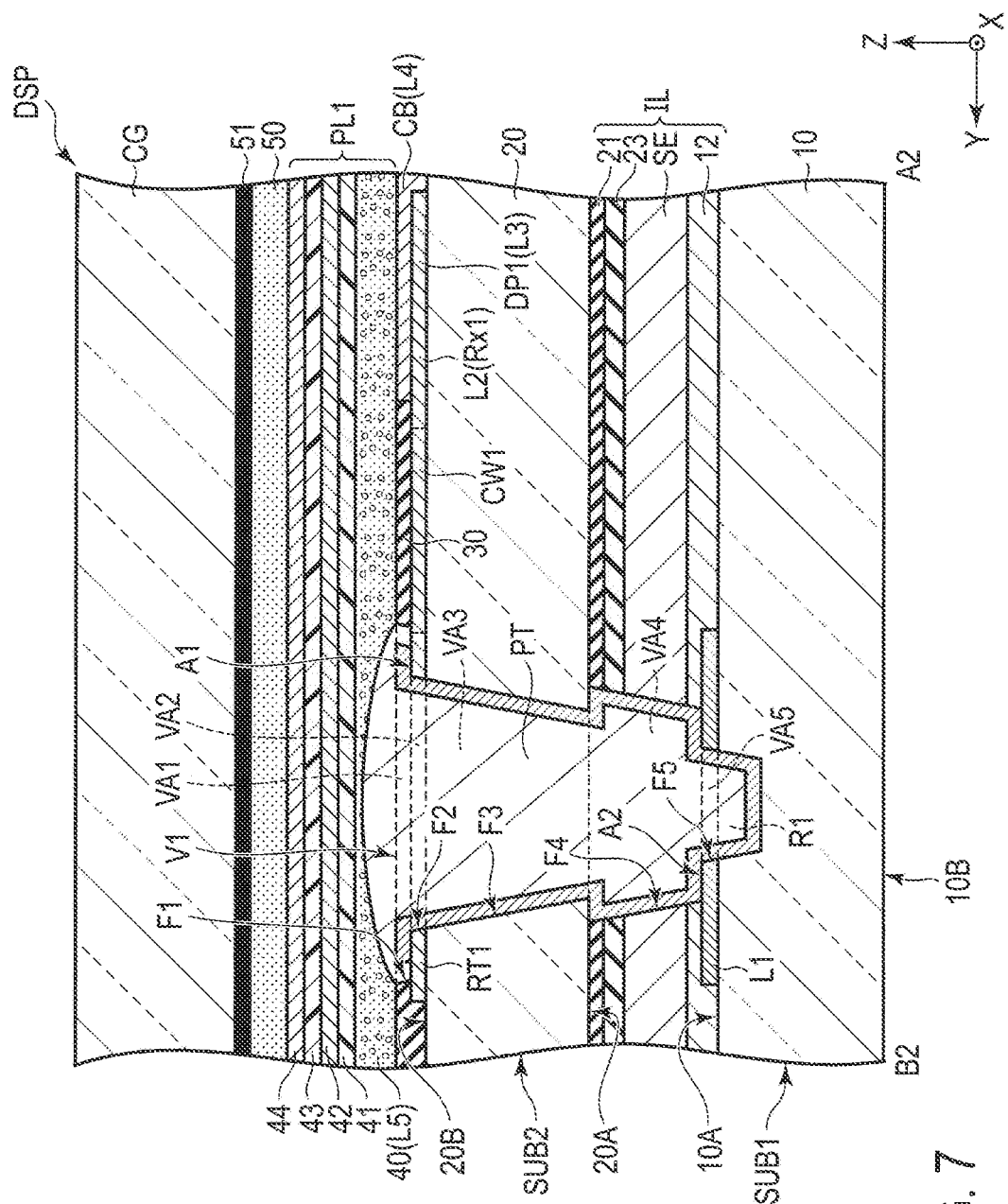
FIG. 7 is a schematic cross-sectional view showing parts of the display device cut along line A2-B2 in FIG. 2.

FIG. 7 is a schematic cross-sectional view showing several parts of the display device DSP cut along line A2-B2 shown in FIG. 2. Illustration of the elements provided on the first substrate SUB1 and the second substrate SUB2 shown in FIG. 4, the illumination device BL, and the second polarizer PL2 is omitted as needed.

The pad DP1 is located on the side of the upper surface 20B of the second base 20. In the example illustrated, the pad DP1 is in contact with the upper surface 20B of the second base 20 and is connected to the terminal portion RT1 via the connection line CW1. In other words, the pad DP1 is located between the second base 20 and the first polarizer PL1.

The conductive layer CB is electrically connected to a part of the second conductive layer L2 (and the pad PD1) and the first polarizer PL1. In the example illustrated, the conductive layer CB is in contact with the pad DP1 of the second conductive layer L2 and a part of the connection line CW. In other words, the conductive layer CB is located between the second conductive layer L2 (and the pad PD1) and the first polarizer PL1. A part of the conductive layer CB also covers the end portion of the pad DP1 and is in contact with the upper surface 20B of the second base 20, in the second direction Y. The upper surface of the conductive layer CB is bonded to the adhesive layer 40 of the first polarizer PL1. The thickness of the part of the conductive layer CB located on the second conductive layer L2 is, for example, smaller than the thickness of the overcoat layer 30. In the example illustrated, the conductive layer CB is in contact with the overcoat layer 30. In the following descriptions, the pad DP (DP1) is often referred to as a third conductive layer L3, the conductive layer CB is often referred to as a fourth conductive layer L4, and the adhesive layer 40 of the first polarizer PL1 is often referred to as a fifth conductive layer L5. For example, formation of the path of the current serving as the ground potential through the fifth conductive layer L5 (adhesive layer 40), the fourth conductive layer L4 (conductive layer CB), the third conductive layer L3 (pad DP), the second conductive layer L2, the connection material C, the first conductive layer L1, and the like can prevent the static electricity, the electric field from the outside, and the like from acting on the display area DA. The fifth conductive layer L5 may not be a conductive adhesive layer if the layer has conductivity. For example, the fifth conductive layer L5 may be formed of a metal material. If the conductive layer CB and the fifth conductive layer L5 are electrically connected to each other, various insulating layers, various conductive layers, and the like may be disposed between the conductive layer CB and the fifth conductive layer L5. In addition, the thickness of a part of the conductive layer CB may be larger than the thickness of the overcoat layer 30.

According to the above-explained structure of the first embodiment, for example, corrosion of the pad DP which is caused by the entering moisture, components included in the adhesive layer 40, or the like can be prevented by covering the pad DP with the conductive layer CB. Since the ground potential can be applied to the adhesive layer 40 of the first polarizer PL1 via the fifth conductive layer L5, the fourth conductive layer L4, the third conductive layer L3, the second conductive layer, the connection material C, the first conductive layer L1, and the like, charging resulting from static electricity of the first polarizer PL1 or the second substrate SUB2 can be prevented. Thus, damage of various lines and circuits which results from discharging of static electricity can be prevented and the manufacturing yields can be improved. In addition, the electric field caused by static electricity or the like can be prevented from acting on the liquid crystal layer LC when the display device DSP is used, and the display quality can be improved.

In addition, the conductive layer CB has a light-shielding property, the light reflected on the pad DP can be prevented from being visually recognized.

Furthermore, the first conductive layer L1 and the second conductive layer L2 are connected to each other through the connection hole V1. Therefore, the first conductive layer L1 and the second conductive layer L2 can connected in extremely small space. Narrowing the frame of the display device DSP can be thereby achieved.

Next, a modified example of the display device DSP according to the present embodiment, and the other embodiment, will be explained. In the modified example and the other embodiments of the display device DSP according to the present embodiment as described below, portions similar to those of the above embodiment are denoted by the same reference numerals and their detailed explanations are omitted, and portions different from those of the embodiment will be particularly explained in detail. In the other configuration examples and the other embodiments, too, the same advantages as those of the above-explained embodiment can be obtained.

<Modified Example of First Embodiment>

Figure 8:
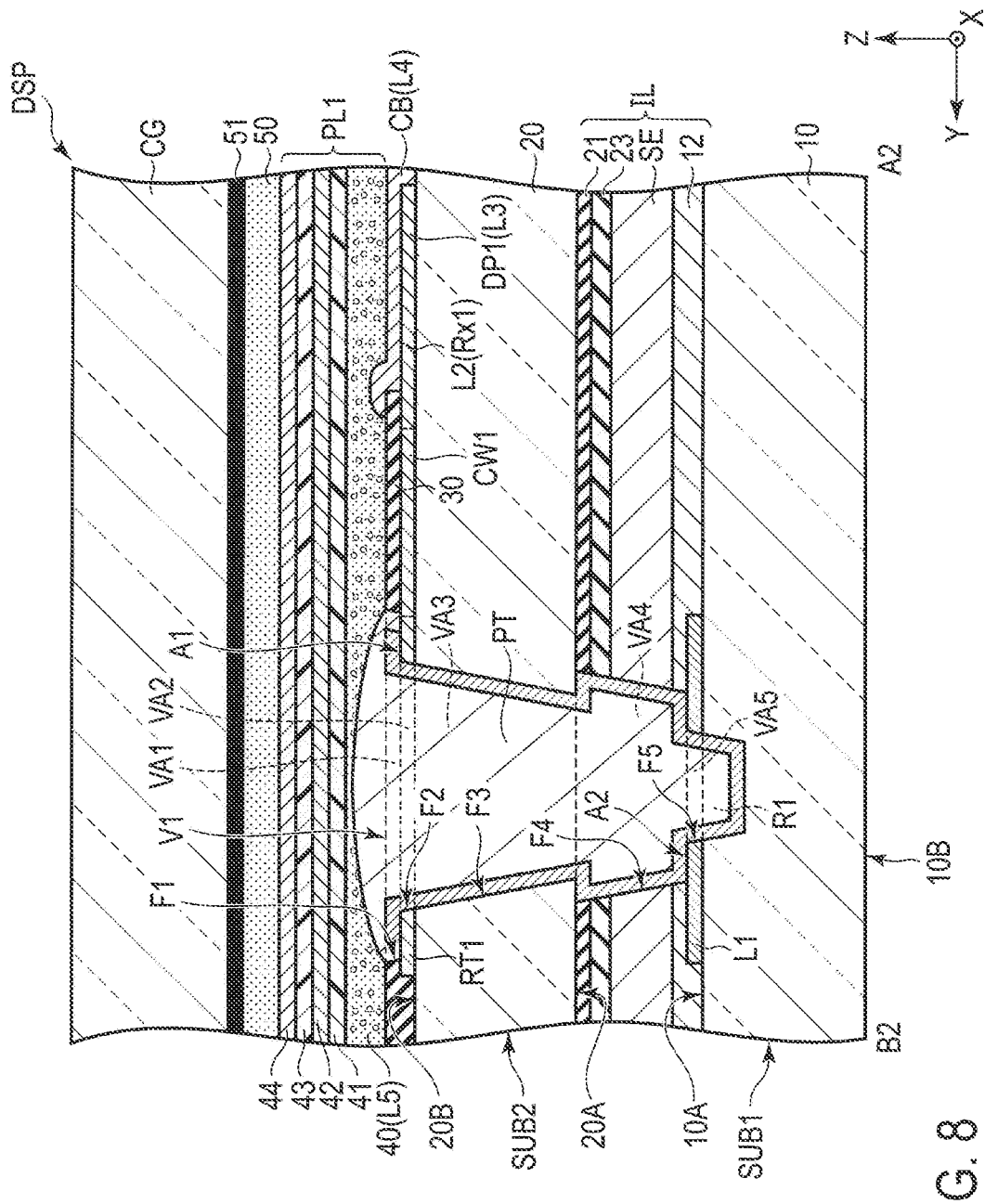
FIG. 8 is a schematic cross-sectional view showing parts of the display device according to another configuration example of the first embodiment.

FIG. 8 is a schematic cross-sectional view showing several parts of the display device DSP according to the other configuration example of the present embodiment. Illustration of the elements provided on the first substrate SUB1 and the second substrate SUB2 shown in FIG. 4, the illumination device BL, and the second polarizer PL2 is omitted as needed.

The example illustrated in FIG. 8 is different from the display device DSP of the above embodiment with respect to a feature that a part of the conductive layer CB is in contact with the upper surface of the overcoat layer 30. In such a configuration, the same advantages as those described above can be achieved.

<Second Embodiment>

Next, a display device DSP according to a second embodiment will be described with reference to FIG. 9 to FIG. 12. The display device DSP of the second embodiment is different from the display device DSP of the first embodiment with respect to a feature of comprising a sixth conductive layer L6 and a seventh conductive layer L7.

Figure 9:
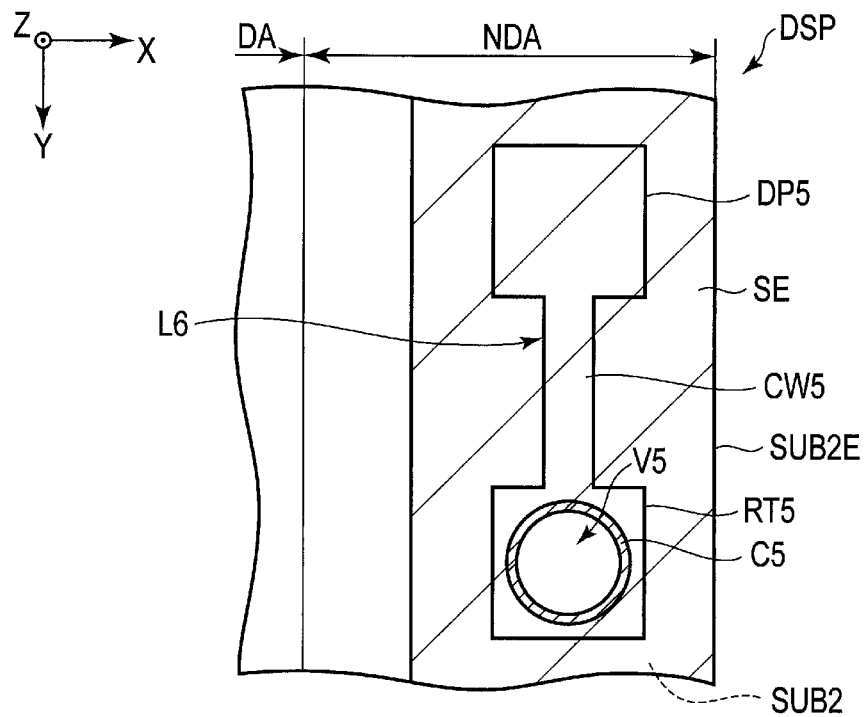
FIG. 9 is a plan view showing an example of a display device according to a second embodiment.

FIG. 9 is a plan view showing an example of the display device DSP according to the second embodiment.

In the display device DSP according to the second embodiment, a sixth conductive layer L6 comprises a pad DP, a terminal portion RT, and a connection line CW. In the example illustrated, the sixth conductive layer L6 comprises a pad DP5, a terminal portion RT5, and a connection line CW5. The sixth conductive layer L6 is located in a non-display area NDA. In the example illustrated, the sixth conductive layer L6 is formed at a position which overlaps a sealant SE in planar view. The sixth conductive layer L6 may be formed of the same material as the above-explained second conductive layer L2. The sixth conductive layer L6 may have a single-layer structure or a multilayer structure. The pad DP5 is electrically connected to the terminal portion RT5 via the connection line CW5. In the example illustrated, the pad DP5 and the terminal portion RT5 are provided in the second direction Y, but may not be provided in the second direction Y. In addition, in the example illustrated, the connection hole V5 is formed at the terminal portion RT5. The connection material C5 is provided at the connection hole V5.

Figure 10:
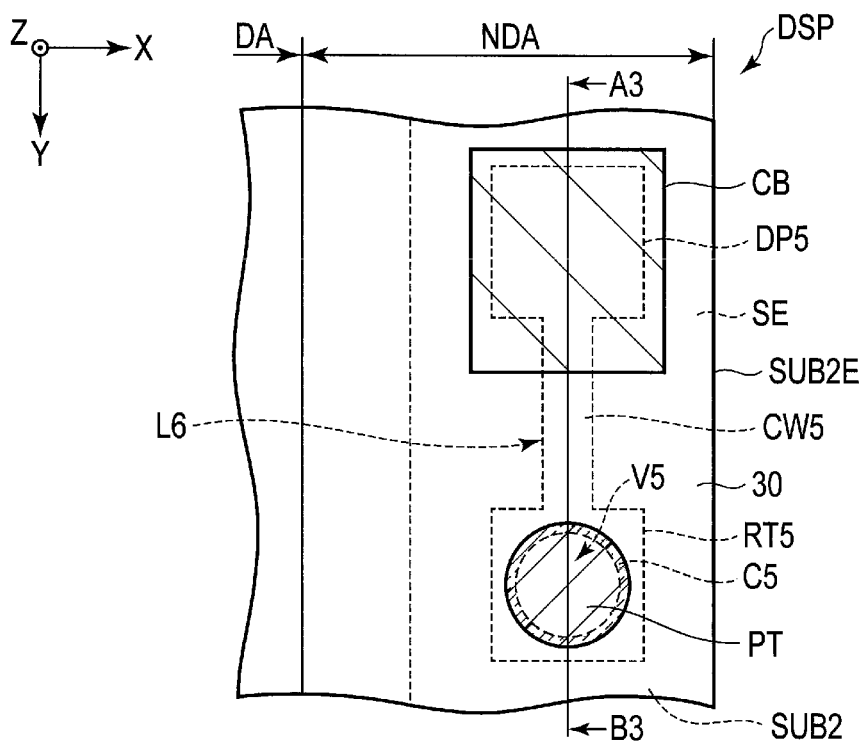
FIG. 10 is a plan view showing examples of a conductive layer, an overcoat layer, and a protection material of the display device according to the second embodiment.

FIG. 10 is a plan view showing examples of a conductive layer CB, an overcoat layer 30, and a protection material PT of the display device DSP according to the second embodiment.

In the example illustrated, the overcoat layer 30 overlaps most parts of the sixth conductive layer L6 in planar view. The overcoat layer 30 does not overlap the pad DP5, the connection hole V5, and the connection material C5. The conductive layer CB overlaps the pad DP5 and a part of the connection line CW5. The conductive layer CB is located in the non-display area NDA and is larger than the pad DP5 in planar view.

FIG. 11 is a schematic plan view showing the display device DSP according to the second embodiment. FIG. 11 mainly illustrates a configuration example of elements related to the connection hole V5.

The display device DSP comprises a seventh conducive layer L7. In the example illustrated, the seventh conductive layer L7 surrounds the display area DA. In the non-display area NDA, the seventh conductive layer L7 overlaps the sealant SE and the first polarizer PL1 in planar view. Both of the ends of the seventh conductive layer L7 are connected to the wiring substrate SUB3. A ground potential (GND) is applied to the seventh conductive layer L7 via the wiring substrate SUB3. The ground potential is a fixed potential, for example, 0V. The seventh conductive layer L7 functions as a guard ring which prevents the static electricity and the electric field from the outside from acting on the display area DA. The shape of the seventh conductive layer L7 is not limited to the example illustrated in FIG. 11, but various aspects of the shape may be adopted. For example, the seventh conductive layer L7 may not surround the display area DA. In addition, the seventh conductive layer L7 may not function as a guard ring but may be a line which merely connects the sixth conductive layer L6 and the wiring substrate SUB3 to each other. In addition, the guard ring is desirably provided at a position which is the outermost to various circuits formed on the first substrate SUB1, from the viewpoint of protecting the circuits against the action of electric field from the external electric field, and can also be configured to be formed along the edge portions of the first substrate SUB1. The above-explained first conductive layer L1 may have the same configuration as the seventh conductive layer L7.

The seventh conductive layer L7 includes the pad P5 at a position which overlaps the sealant SE. For example, the pad P5 corresponds to the region where the line width of the seventh conductive layer L7 is increased. The connection hole V5 is provided at a position which overlaps the pad P in planar view. In the example illustrated in FIG. 11, the pad P5 and the connection hole V5 are provided at a second side portion (on the right side) of the non-display area NDA. However, the pad P5 and the connection hole V5 may be provided at the other position, and plural pads and plural connection holes may be provided. In addition, the pad P5 may not be provided and the connection hole V5 may be provided at the position which overlaps the seventh conductive layer L7 having a constant line width.

FIG. 12 is a schematic cross-sectional view showing parts of the display device DSP according to the second embodiment. Illustration of the elements provided on the first substrate SUB1 and the second substrate SUB2 shown in FIG. 4, the illumination device BL, and the second polarizer PL2 is omitted as needed.

The first substrate SUB1 comprises a seventh conductive layer L7. In the example illustrated, the seventh conductive layer L7 is formed on the upper surface 10A of the first base 10 and is covered with the second insulating layer 12. In examples including the present example, various insulating layers and various conductive layers may be disposed between the seventh conductive layer L7 and the first base 10 and between the seventh conductive layer L7 and the second insulating layer 12. The seventh conductive layer L7 is formed of, for example, a metal material such as molybdenum, tungsten, titanium, aluminum, silver, copper or chromium or an alloy formed by a combination of these metal materials or may be formed of a transparent conductive material such as ITO or IZO. The seventh conductive layer L7 may have a single-layer structure or a multilayer structure.

The sixth conductive layer L6 is located on the side of the upper surface 20B of the second base 20. In the example illustrated, the sixth conductive layer L6 is covered with the overcoat layer 30. In addition, the sixth conductive layer L6 is in contact with the upper surface 20B of the second base 20. A pad DP5 (third conductive layer L3) is located on the side of the upper surface 20B of the second base 20. In the example illustrated, the pad DP5 is in contact with the upper surface 20B of the second base 20 and is connected to the terminal portion RT5 via the connection line CW5.

The conductive layer CB is electrically connected to a part of the sixth conductive layer L6 and the first polarizer PL1. In the example illustrated, the conductive layer CB is in contact with the pad DP5 of the sixth conductive layer L6 and a part of the connection line CW5. A part of the conductive layer CB also covers the end portion of the pad DP5 and is in contact with the upper surface 20B of the second base 20, in the second direction Y. The upper surface of the conductive layer CB is in contact with the adhesive layer 40 of the first polarizer PL1. The thickness of the part of the conductive layer CB located on the sixth conductive layer L6 is, for example, smaller than the thickness of the overcoat layer 30. The thickness of the part of the conductive layer CB may be larger than the thickness of the overcoat layer 30. In addition, various insulating layers and various conductive layers may be disposed between the sixth conductive layer L6 and the upper surface 20B. In addition, various insulating layers and various conductive layers may also be disposed between the overcoat layer 30 and the sixth conductive layer L6.

The overcoat layer 30 includes a through hole VA6. The sixth conductive layer L6 includes a through hole VA7 which connects with the through hole VA6. The second base 20 includes a through hole VA8 which penetrates the lower surface 20A and the upper surface 20B and communicates with the through holes VA6 and VA7. The insulating layer IL includes a through hole VA9 which penetrates the lower surface 20A and the upper surface 10A and communicates with each of the through holes VA6, VA7, and VA8. The seventh conductive layer L7 includes a through hole VA10 which communicates with each of the through holes VA6 to VA9. In addition, the first base 10 includes a recess portion R2 which communicates with each of the through holes VA6 to VA10, on the upper surface 10A. In the example illustrated, the through holes VA6 to VA10 and the recess portion R2 are located in the non-display area NDA. The through hole VA9 penetrates the layers constituting the insulating layer IL, i.e., the sealant SE, the second insulating layer 12, the light-shielding layer 21, and the overcoat layer 23 in the example shown in FIG. 12. Substantially the same configuration of the above-explained recess portion R1 can be applied to the recess portion R2. For this reason, detailed explanations of the recess portion R2 are omitted.

The through holes VA6 to VA10 and the recess portion R2 are located in the same straight line along the third direction Z with their hole centers positioned to coincide with one another in planar view, and constitute the connection hole V5. Each of the through holes VA6 to VA10 and the recess portion R2 is shaped in, for example, a regular circle in planar view but the shape may be the other shape such as an ellipse. The connection hole V5 may be composed of at least one of the through holes VA6 to VA10 and the recess portion R2 located in the same straight line along the third direction.

In the example illustrated in FIG. 12, the width (inner diameter) of each of the through holes VA6 to VA10 becomes smaller in the downward direction. That is, an inner surface F6 of the through hole VA6, an inner surface F7 of the through hole VA7, an inner surface F8 of the through hole VA8, an inner surface F9 of the through hole VA9, and an inner surface F10 of the through hole VA10 is tapered to the third direction Z. In the example illustrated in FIG. 12, a cross-section of each of the inner surfaces F6 to F10 has a linear shape but may be curved. In addition, the width (inner diameter) of each of the through holes VA6 to VA10 may be smaller to the upward direction or the width may be constant (i.e., the each of the inner surfaces F6 to F10 may be parallel to the third direction Z).

The width of the through hole VA6 is larger than the width of the through hole VA7 in the vicinity to the boundary between the through holes VA6 and VA7. The sixth conductive layer L6 thereby includes the third region A3 exposed from the overcoat layer 30 in the surrounding of the through hole VA7. For example, the shape of the third region A3 in planar view is an annular shape surrounding the whole periphery of the through hole VA7. However, the third region A3 may be provided at part of the surrounding of the through hole VA7 or plural third regions A3 may be provided intermittently.

The width of the through hole VA9 is larger than the width of the through hole VA10 in the vicinity to the boundary between the through holes VA9 and VA10. The seventh conductive layer L7 thereby includes the fourth region A4 exposed from the insulating layer IL in the surrounding of the through hole VA10. For example, the shape of the fourth region A4 in planar view is an annular shape surrounding the whole periphery of the through hole VA10. However, the fourth region A4 may be provided at part of the surrounding of the through hole VA10 or plural fourth regions A4 may be provided intermittently.

The display device DSP further comprises a connection material C5 which electrically connects the sixth conductive layer L6 to the seventh conductive layer L7 through the through holes VA7 to VA10. The connection material C5 sequentially covers the inner surfaces F6 to F10 of the through holes VA6 to VA10, the inner surface of the recess portion R2, the third region A3, and the fourth region A4 without interruption.

The connection material C5 is in contact with not only the inner surface F10 of the through hole VA10, but also the seventh conductive layer L7 in the fourth region A4. The contact area can be thereby increased as compared with a case where the connection material C is in contact with the only inner surface F10, and the reliability in conduction is increased. In addition, the connection material C5 is in contact with not only the inner surface F7 of the through hole VA7, but also the sixth conductive layer L6 in the third region A3. The contact area can be thereby increased as compared with a case where the connection material C is in contact with the inner surface F7, and the reliability in conduction is increased.

The inside of the connection material C5 is filled with the protection material PT. In the example illustrated, the protection material PT also covers the end portion of the connection material C located in the third region A3. Part of the protection material PT protrudes above the through hole VA6. The protection material PT may not protrude from the through hole VA6.

According to the configuration, formation of the path of the current serving as the ground potential through the fifth conductive layer L5, the fourth conductive layer L4, the third conductive layer L3, the sixth conductive layer L6, the connection material C, the seventh conductive layer L7, and the like can prevent the static electricity, the electric field from the outside, and the like from acting on the display area DA.

According to the second embodiment, the same advantages as those of the first embodiment can be obtained.

In each of the embodiments, the connection holes V1 and V5 include the recess portions R1 and R2 of the first base 10, respectively, but may not include the recess portions R1 and R2, respectively. In addition, the connection holes V1 and V5 may not include the through holes VA5 and VA10 penetrating the first conductive layer L1, respectively.

Examples of the display device which can be obtained from the configurations disclosed in the present specification will be hereinafter explained.

(1)

A display device, comprising:

a first substrate including a first conductive layer;

a second substrate including a base having a first lower surface opposed to the first substrate and a first upper surface on a side opposite to the first lower surface;

a display function layer disposed between the first substrate and the second substrate;

a second conductive layer provided on the first upper surface;

a third conductive layer provided on the first upper surface and electrically connected to the second conductive layer;

a fourth conductive layer covering the third conductive layer and having a light-shielding property;

a first through hole provided in the base;

a connection material electrically connecting the first conductive layer and the second conductive layer to each other; and an insulating material overlapping the first through hole and the connection material and having a light-shielding property, wherein the connection material is in contact with the first conductive layer and the second conductive layer through the first through hole.

(2)

The display device according to (1), wherein the display device includes a display area in which an image is displayed and a non-display area surrounding the display area, and the third conductive layer and the fourth conductive layer are located in the non-display area.

(3)

The display device according to (1) or (2), further comprising:

a polarizer provided on a second upper surface of the fourth conductive layer, wherein the polarizer includes a fifth conductive layer electrically connected to the second upper surface, and the fifth conductive layer is a conductive adhesive layer bonding the polarizer to the fourth conductive layer and including a conductive material.

(4)

The display device according to (3), further comprising:

an overcoat layer located between the polarizer and the second conductive layer, wherein the fourth conductive layer is in contact with the overcoat layer.

(5)

The display device according to (4), wherein the overcoat layer has a third upper surface on the polarizer side, and the fourth conductive layer is in contact with the third upper surface of the overcoat layer.

(6)

The display device according to one of (1) to (5), wherein the fourth conductive layer overlaps the third conductive layer in planar view.

(7)

The display device according to one of (1) to (6), wherein a ground potential is applied to the first conductive layer.

(8)

The display device according to one of (1) to (7), further comprising:

an insulating layer disposed between the first conductive layer and the base, wherein the insulating layer includes a second through hole communicating with the first through hole, and the connection material is in contact with the first conductive layer and the second conductive layer through the first through hole and the second through hole.

(9)

The display device according to one of (1) to (8), wherein the fourth conductive layer overlaps a part of the second conductive layer.

(10)

The display device according to one of (1) to (9), wherein the fourth conductive layer is a black organic insulating material.

(11)

The display device according to (10), wherein the insulating material is a black organic insulating material.

(12)

A display device, comprising:

a first substrate including a first conductive layer;

a second substrate including a base having a first lower surface opposed to the first substrate and a first upper surface on a side opposite to the first lower surface;

a display function layer disposed between the first substrate and the second substrate;

a second conductive layer located on the first upper surface side;

a third conductive layer located on the first upper surface side and electrically connected to the second conductive layer;

a fourth conductive layer overlapping the third conductive layer and having a light-shielding property;

a first through hole provided in the base; and a connection material electrically connecting the first conductive layer and the second conductive layer to each other, the connection material being in contact with the first conductive layer and the second conductive layer through the first through hole.

(13) The display device according to (12), wherein
the fourth conductive layer overlaps a part of the second conductive layer.

(14) The display device according to (12), further comprising:
a polarizer located on the first upper surface side, wherein
the second conductive layer and the third conductive layer are located between the base and the polarizer, and
the fourth conductive layer is located between the second and third conductive layers and the polarizer.

(15) The display device according to (12), wherein
the fourth conductive layer is electrically connected to the third conductive layer.

(16) The display device according to (14), wherein
the polarizer includes a fifth conductive layer bonded to the fourth conductive layer and including a conductive material.

(17) The display device according to (12), wherein
the fourth conductive layer is a black organic insulating material.

(18) The display device according to (12), further comprising:
an insulating material overlapping the first through hole and the connection material and having a light-shielding property.

(19) The display device according to (18), wherein
the insulating material is located in the first through hole.

(20) The display device according to (18), wherein
the insulating material is a black organic insulating material.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device, comprising:
a first substrate including a first conductive layer;
a second substrate including a base having a first lower surface opposed to the first substrate and a first upper surface on a side opposite to the first lower surface;
a display function layer disposed between the first substrate and the second substrate;
a second conductive layer provided on the first upper surface;
a third conductive layer provided on the first upper surface and electrically connected to the second conductive layer;
a fourth conductive layer covering the third conductive layer and having a light-shielding property;
a first through hole provided in the base;
a connection material electrically connecting the first conductive layer and the second conductive layer to each other;
an insulating material overlapping the first through hole and the connection material and having a light-shielding property, and
an insulating layer disposed between the first conductive layer and the base,
wherein
the connection material is in contact with the first conductive layer and the second conductive layer through the first through hole; the insulating layer includes a second through hole communicating with the first through hole, and
the connection material is in contact with the first conductive layer and the second conductive layer through the first through hole and the second through hole.

2. The display device according to claim 1, wherein
the fourth conductive layer overlaps a part of the second conductive layer.

3. A display device, comprising:
a first substrate including a first conductive layer;
a second substrate including a base having a first lower surface opposed to the first substrate and a first upper surface on a side opposite to the first lower surface;
a display function layer disposed between the first substrate and the second substrate;
a second conductive layer provided on the first upper surface;
a third conductive layer provided on the first upper surface and electrically connected to the second conductive layer;
a fourth conductive layer covering the third conductive layer and having a light-shielding property;
a first through hole provided in the base;
a connection material electrically connecting the first conductive layer and the second conductive layer to each other;
an insulating material overlapping the first through hole and the connection material and having a light-shielding property; and
a polarizer provided on a second upper surface of the fourth conductive layer,
wherein
the connection material is in contact with the first conductive layer and the second conductive layer through the first through hole,
the polarizer includes a fifth conductive layer electrically connected to the second upper surface, and
the fifth conductive layer is a conductive adhesive layer bonding the polarizer to the fourth conductive layer and including a conductive material.

4. The display device according to claim 3, wherein
the fourth conductive layer overlaps the third conductive layer in planar view.

5. The display device according to claim 3, wherein
a ground potential is applied to the first conductive layer.

6. The display device according to claim 3, further comprising:
an overcoat layer located between the polarizer and the second conductive layer,
wherein
the fourth conductive layer is in contact with the overcoat layer.

7. The display device according to claim 6, wherein
the overcoat layer has a third upper surface on the polarizer side, and the fourth conductive layer is in contact with the third upper surface of the overcoat layer.

8. A display device, comprising:
a first substrate including a first conductive layer;
a second substrate including a base having a first lower surface opposed to the first substrate and a first upper surface on a side opposite to the first lower surface;
a display function layer disposed between the first substrate and the second substrate;
a second conductive layer located on the first upper surface side;
a third conductive layer located on the first upper surface side and electrically connected to the second conductive layer;
a fourth conductive layer overlapping the third conductive layer and having a light-shielding property;
a first through hole provided in the base;
a connection material electrically connecting the first conductive layer and the second conductive layer to each other, and
a polarizer located on the first upper surface side; wherein
the connection material being in contact with the first conductive layer and the second conductive layer through the first through hole;
the second conductive layer and the third conductive layer are located between the base and the polarizer;
the fourth conductive layer is located between the second and third conductive layers and the polarizer, and
the polarizer includes a fifth conductive layer bonded to the fourth conductive layer and including a conductive material.

9. The display device according to claim 8, wherein the fourth conductive layer overlaps a part of the second conductive layer.

10. The display device according to claim 8, wherein the fourth conductive layer is electrically connected to the third conductive layer.

11. The display device according to claim 8, further comprising:
an insulating material overlapping the first through hole and the connection material and having a light-shielding property.

12. The display device according to claim 11, wherein the insulating material is located in the first through hole.

13. The display device according to claim 11, wherein the insulating material is a black organic insulating material.

* * * * *